(12) United States Patent
Dinges et al.

(10) Patent No.: US 7,917,891 B2
(45) Date of Patent: Mar. 29, 2011

(54) ENGINEERING SYSTEM WITH AUTOMATIC GENERATION OF ENTITY TEMPLATES

(75) Inventors: Clemens Dinges, Obermichelbach (DE); Rainer Heller, Eckental (DE); Ronald Lange, Fürth (DE); Soeren Moritz, Wimmelbach (DE); Peter Mossmeier, Fürth (DE); Maximilian Sackerer, Petersaurach (DE)

(73) Assignee: Siemens Aktiengesellschaft, Munich (DE)

( * ) Notice: Subject to any disclaimer, the term of this patent is extended or adjusted under 35 U.S.C. 154(b) by 1133 days.

(21) Appl. No.: 11/291,594

(22) Filed: Nov. 30, 2005

(65) Prior Publication Data
US 2006/0117043 A1 Jun. 1, 2006

(30) Foreign Application Priority Data

Nov. 30, 2004 (DE) .......................... 10 2004 057 727

(51) Int. Cl.
G06F 9/44 (2006.01)
(52) U.S. Cl. .......................... 717/109; 717/101; 717/113
(58) Field of Classification Search .......... 717/100–102, 717/110–113, 120, 123
See application file for complete search history.

(56) References Cited

FOREIGN PATENT DOCUMENTS
WO WO 01/25860 A1 4/2001

OTHER PUBLICATIONS

Autodesk, "AutoCAD Electrical 2004—Technical Overview", 2003, http://autodesk.com/autocadelectrical, pp. 1-70.*
Autodesk-Press Room, "Autodesk Introduces AutoCAD Electrical 2004 to Help Controls Engineers Reduce Costs, Shorten Time to Market, and Improve Accuracy", 2003, AutoDesk Inc., pp. 1-3.*
Siemens AG; "SIMATIC CFC for S7 Continuous Function Chart V6.0 Manual"; [Online May 9, 2003]; XP002363209, [found on Internet at] URL:http://support.automation.siemens.com/WW/llisapi.d11?func=11&objid=15236182&caller=view&lang=de&siteid=cseus&aktprim=0&objaction=csopen> [Retrieved on Jan. 16, 2006]; p. 1.
"SIMATIC CFC für S7 Continuous Function Chart Handbuch", Jan. 2003, SIEMENS AG, XP002363212, [Found on Internet at]: URL:http://pcs.khe.siemens.com/index.asp?Nr.=5844>, [Retrieved on Jan. 16, 2006], pp. 1-6 thru 1-8, 2-17, 3-12, 3-13, 3-16.
Guenter Marxen; "Textverarbeitung mit Microsoft Word 97 für Windows"; "Text processing with Microsoft Word 97 for Windows"; Sep. 2000; Center for Applied Computer Science of the University to Cologne; XP002363213; [found on Internet at] URL:http://www.uni-koeln.de/rrzk/kurse/unterlagen/winword/winword97.pdf> [Retrieved on Jan. 17, 2006]; pp. 14-15 and 31-35.
Gert Florijn, Marco Meijers, Pieter Van Winsen; "Tool Support for Object Oriented Patterns"; ECOOP: European Conference on Object Oriented Programming; Sep. 6, 1997; pp. 472-495, XP008024252.
Richard M. Stallman and Roland McGrath; "GNU Make: A Program for Directing Recompilation"; [Online May 1996]; XP002364380, [Found on Internet at] URL:http://1g1.epfl.ch/teaching/case_tools/doc/make-3.75/make_toc.html> [Retrieved on Jan. 25, 2006]; pp. 31-35. Borning A.H.: "Classes versus prototypes in object-oriented languages", IEEE 1986, Department of Computer Science, FR-35, University of Washington, Seattle, Washington 98195, pp. 36-40.

* cited by examiner

Primary Examiner — Ted T Vo

(57) ABSTRACT

A method, computer program and a system for automatically generating entity templates when copying at least one software element are provided. In the method, upon receiving a request to copy a selected element, such as a group of elements in a graphics program, a common entity template is automatically created for the element if it is not currently linked to an entity template or is only linked to a non-modifiable template, such that when modifications are made to the entity template, the modifications are also made to the originally selected element and all copies thereof, simultaneously.

6 Claims, 1 Drawing Sheet

ENGINEERING SYSTEM WITH AUTOMATIC GENERATION OF ENTITY TEMPLATES

CROSS REFERENCE TO RELATED APPLICATIONS

This application claims priority of German application No. 10 2004 057 727.7 DE filed Nov. 30, 2004, which is incorporated by reference herein in its entirety.

FIELD OF INVENTION

The invention relates to a method and a system for copying at least one software element.

BACKGROUND OF INVENTION

This type of system or method is employed in a very wide diversity of applications for computer-aided creation of graphics and texts as well as in CAD applications.

This type of system or method is employed especially in automation technology for design, implementation or commissioning of plant and machinery. To keep the outlay for such engineering tasks as low as possible efforts are usually made to refer back to existing components and modules, from old projects for example, and to adapt these to the requirements of current projects.

If for example a number of chain conveyors are needed in a project and if a corresponding element already exists for describing a chain conveyor in information technology terms, one solution would be to transfer this element into the current project and adapt it to the project-specific demands.

For software implementation of a number of chain conveyors copies of the element are created. When the copies are created there is often the desire for changes made to the element to be effective for all chain conveyors contained in the project. The methods which exist for this type of retrospective modification of all copies are currently as follows:

In the type concept a user deliberately creates a re-usable information unit—the type. The user can form entities which refer to the type. Parameters can be defined for the type on the basis of which entity-specific modifications can be made. The entity points to the type and uses the structure and the behaviour of the type directly. This means that the basic behaviour of an entity can only be modified by modifying the associated type. The link between entity and type is strict, i.e. the entity is not capable of existence without the type.

With the template concept the user similarly creates a re-usable information unit—the template. Unlike the type concept however, in this case the user perceives an entity based on the template as a copy of the template and at the same time as a self-contained information element. Entity-specific changes can be made by the user by modifying the entity. The system detects whether modifications made are to be interpreted as setting of parameters for the entity or must lead to a removal from the original template.

By contrast with the type concept, modifications can be made in the template concept both to the template and also to the entities. The template behaves like an entity for the user. If the template is modified the change can be transferred automatically, or if required, manually by the user to all entities linked to the template, in which case the entity-specific modifications are not overwritten.

What both the type concept and also the template concept have in common is that users can form their own re-usable information unit and thus have the opportunity to modify entities and copies of entities by modifying the type or the template in the same way. The changes however only affect all copies of an entity if all copies and also the original entity are linked to the template or to the type.

For copying of basic elements—elements which are inherent in the system—no link is created in current systems between the original basic element and its copy. Basic element and copy behave as two independent entities.

SUMMARY OF INVENTION

The underlying object of the invention is to specify a method and a system for simplified processing of software-based projects.

This object is achieved by a method for copying at least one software element, in which the following steps are executed prior to copying:

Checking whether a connection exists between the software element and an entity template able to be modified by a user.

and where no connection exists:

Creating an entity template able to be modified by the user based on the software element and Connecting the software element to the entity template.

Furthermore this object is achieved by a computer program product for executing such a method.

Furthermore this object is achieved by a system for project planning of data with a processing unit (402) for copying at least one software element, with the processing unit (402) being provided to execute the following steps before copying:

Checking whether a connection exists between the software element and an entity template able to be modified by a user.

and where no connection exists:

Creating an entity template able to be modified by the user based on the software element and Connecting the software element to the entity template.

The method in accordance with the invention is designed as follows:

After a user has issued a command for copying a software element, the processing unit checks whether the software element is connected to the entity template. The term entity template here, as in the entire document, includes both a type in accordance with the type concept mentioned at the beginning and also a template in accordance with the template concept depicted at the beginning. If such a connection exists, the copying process is initiated directly. In this case modifications can be made to the original element and to its copy in the same way in which the corresponding entity template is modified.

If there is not yet a connection between the original software element and an entity template, an entity template is first generated on the basis of the original software element and subsequently the original element is linked to the entity template. Then the copying process is initiated.

In this way it is ensured that an entity and all copies of the entity are linked to the same entity template. If there is a request to change the entity, modifications are applied subsequently to all copies. This involves only having to modify the template linked to the entity and to its copies or the type linked to the entity and to its copies.

In an advantageous embodiment of the invention the processing unit is provided for automatic execution of at least one step of the method with operator intervention. It is naturally also conceivable for all procedural steps to be executed automatically as soon as the user indexes a copying command.

An automatic execution of the procedural steps is under some circumstances not useful for all applications, since it may be that the connection with an entity template is not desired for each software element to be copied. In such cases it is expedient for the processing unit to be provided for user-controlled execution of at least one step of the method. In this case the types of software element for which an entity template modified by the user is required can for example be defined by the user in advance. It is conceivable for example that an entity template is only to be created for software elements which have been created from grouped individual elements. For software elements for which no entity template is desired, said procedural steps are not executed before the copying process.

Alternatively the procedural step of "checking whether a connection exists between the software element and an entity template able to be modified by a user" is first executed. If it is established In this case that no connection exists, the user is asked via a dialog window for example whether he wishes to create a corresponding entity template for the selected element.

An advantageous embodiment of the inventive system is designed such that the processing unit is provided for copying grouped system-inherent basic elements. System-inherent basic elements are not linked to an entity template modifiable by the user. If the user groups a number of basic elements into a new software element, one of the requirements is for copies of the newly-created software element—of the group—to be created. With such an embodiment a new and user-modifiable entity template is created for the group of basic elements before copying. Thus the group and copies of the group are linked to a common user-modifiable entity template via which modifications can be made simultaneously for the originally created group and for its copies.

Further advantageous embodiments of the system are characterized by the system being provided for creation of graphics and/or text. For the creation of graphics there is often the desire to copy a graphics object which has been created once in order to thus reduce the effort involved in creating the graphics. If modifications are to be made to the graphics object and to the copies created in the same way after copying, these modifications can be executed very efficiently for original and copies on the basis of the common entity template.

A specific variant of the inventive system is embodied as an engineering system especially for describing the behavior of components in automation technology. The simplicity of the engineering is a significant success factor in the design, implementation and commissioning of plant and machinery specifically in the automation environment. In such engineering tasks a user generally attempts to re-use part of the information from old projects in a current project, more than once if possible. Project-specific modifications can be very easily transferred to all copies of the part information by the automatic creation of an entity template.

BRIEF DESCRIPTION OF THE DRAWINGS

The invention is described and explained in more detail below on the basis of the exemplary embodiments shown in the Figures. The figures show.

DETAILED DESCRIPTION OF INVENTION

Figure 1:
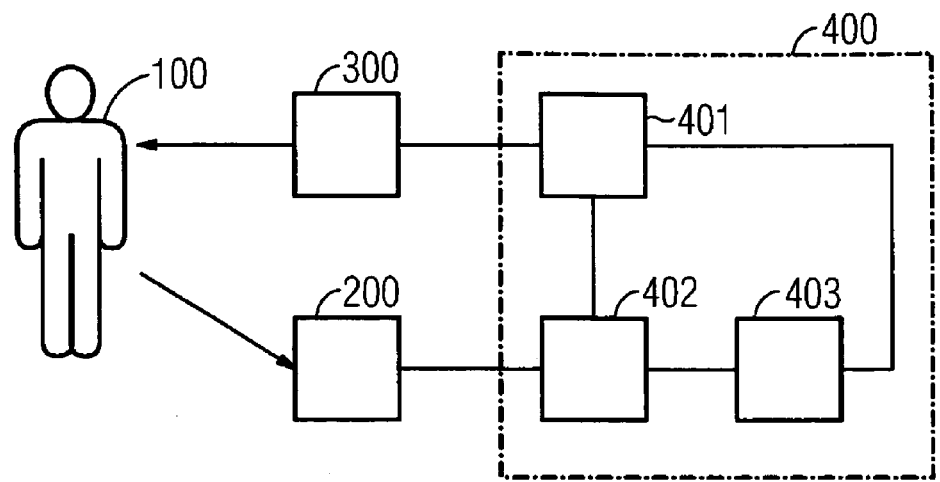
FIG. 1 a schematic diagram of an engineering system with automatic generation of entity templates and FIG. 2 a flowchart of a method for automatic generation of entity templates in a copying process.

FIG. 1 shows a schematic diagram of an engineering system 400 with automatic generation of entity template. The engineering system 400 is used to describe the behavior of programmable logic controllers in the automation technology system.

The engineering system 400 includes a user interface 401 for presentation of project data and of commands currently available to a user 100. Furthermore the engineering system 400 features a memory 403 in which on the one hand project data and on the other data about basic elements, templates and types as well as entities of templates and types are stored.

Furthermore the engineering system 400 has a processing unit 402 with which the application control of the engineering system 400 is implemented. The application control uses a subordinate scheduling system to record commands entered by the user via an input device 200 and interprets these. The commands have an effect on project data stored in the memory 403 and on the currently available commands. Information of the engineering system 400 is displayed to the user 100 via an output device 300.

A method for automatic generation of entity templates is executed by the processing unit 402, especially for a copying command entered by the user 100. Such a method is shown in FIG. 2 and is described below.

Figure 2:
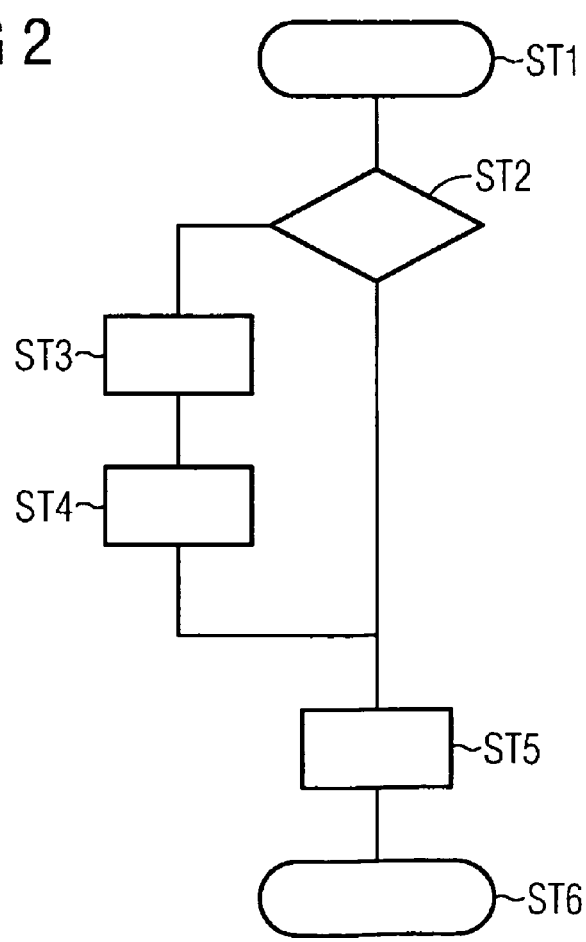

FIG. 2 shows a flowchart of a method for automatic generation of entity templates in a copying process. The method is started by a user request ST1 for copying a selected element. The selected element involved is a graphics element which was created by grouping basic elements in a graphics program. For example the group created in this way involves a symbol which consists of the inherent basic elements rectangle and line from the graphics program, with the symbol being constructed from two lines forming a diagonal cross arranged within the rectangle.

In a second step ST2 an automatic check is made as to whether the selected group is linked to an entity template which can be both a type according to the type concept and also a template according to the template concept. If such a connection exists and if the entity template involved is an entity template that can be edited by the user the element is copied directly.

If on the other hand it is established in the second step ST2 that the group is not linked to any entity template or is linked to a system-inherent template that cannot be modified by the user, the program branches to a third step ST3. In the third step ST3 an entity template is generated on the basis of the selected group of basic elements. The entity template is filled with information of the selected group.

Subsequently in the fourth step ST4 the selected group is connected to the newly-generated entity template, which can be both a type and also a template, depending on the concept.

In the fifth step ST5 the selected group, which is now linked to the newly-created entity template, is finally copied. In this way the copy of the selected group is also connected to the entity template. By using this method. modifications which are now made to the entity template can be rendered effective for both the original selected group and also for its copy. For example a user of the graphics program can modify the line thickness of the diagonal cross for the originally selected group as well as for all copies created directly on the entity template.

In the sixth step ST6 a user interface available to the user is finally updated in order to display the current state of the project data.

The present invention is not intended to be limited to the exemplary embodiments shown here. Instead further embodiments are conceivable and are encompassed by the invention provided the basic idea is retained of a check being made in a first step as to whether a connection exists between the selected software element and an entity template able to be modified by the user, and if no connection exists, an entity template able to be modified by the user is created and the software element is connected to the entity template. The method is thus not only applicable to graphics elements but also especially to text elements. For example the inventive method can be used to copy a paragraph of text which is not linked to a format template. During the copying process a format template for the paragraph is generated automatically or after a dialog with a user, so that changes can be made subsequently to the format template and these effect both the original paragraph and also the copy.

The invention claimed is:

1. A method for automatically generating a corresponding entity template linked to a graphic element when copying the graphic element, comprising:
   (a) receiving by a processor in an engineering system via an input device a copy command comprising a request to create a copy of a selected graphic element, wherein the selected graphic element consists of a graphic symbol constructed by a grouping of basic graphic elements arranged into the graphic symbol;
   (b) prior to executing the copy command of the selected graphic element, automatically checking by the processor whether the selected graphic element is linked to a user modifiable entity template stored in memory of the engineering system, wherein the user modifiable entity template consists of a re-useable information unit describing the selected graphic element in information technology terms; and if the selected graphic element is not linked to the user modifiable entity template,
      (i) automatically generating a corresponding user modifiable entity template based on information describing the selected graphic element in information technology terms,
      (ii) storing the corresponding user modifiable entity template in memory of the engineering system, and
      (iii) linking the selected graphic element to the corresponding user modifiable entity template generated; and
   (c) executing by the processor the copy command by
      (i) copying the selected graphic element to create a copy of the selected graphic element, and
      (ii) linking the copy to the corresponding user modifiable entity template, such that both the selected graphic element and the copy created are now both linked to the corresponding user modifiable entity template;
   wherein the user modifiable entity template is adapted to be user-modifiable such that modifications made to the user modifiable entity template are rendered, based on the linking, to both the selected graphic element and the copy of the selected graphic element.

2. The method of claim 1 wherein the information describing the selected element comprises one or more of type information for describing the structure and behaviour of the selected element, or template information comprising parameters and formatting for the selected element.

3. A computer system for project planning of data with a processing unit for automatically generating a corresponding entity template linked to a graphic element when copying the graphic element, comprising:
   an engineering system having a user interface with an input device for receiving input from a user;
   a memory in the engineering system for storage;
   a processor in the engineering system adapted to:
      (a) receive via the input device a copy command comprising a request to create a copy of a selected graphic element, wherein the selected graphic element consists of a graphic symbol constructed by a grouping of basic graphic elements arranged into the graphic symbol;
      (b) prior to executing the copy command of the selected graphic element, automatically check whether the selected graphic element is linked to a user modifiable entity template stored in the memory, wherein the user modifiable entity template consists of a re-useable information unit describing the selected graphic element in information technology terms; and if the selected graphic element is not linked to the user modifiable entity template,
         (i) automatically generate a corresponding user modifiable entity template based on information describing the selected graphic element in information technology terms,
         (ii) store the corresponding user modifiable entity template in the memory, and
         (ii) link the selected graphic element to the corresponding user modifiable entity template generated; and
      (c) execute the copy command by
         (i) copying the selected graphic element to create a copy of the selected graphic element, and
         (ii) linking the copy to the corresponding user modifiable entity template, such that both the selected graphic element and the copy created are now both linked to the corresponding user modifiable entity template;
   wherein the user modifiable entity template is adapted to be user-modifiable such that modifications made to the user modifiable entity template are rendered by the processor, based on the linking, to the selected graphic element and the copy of the selected graphic element.

4. The system of claim 3 wherein the information describing the selected element comprises one or more of type information for describing the structure and behaviour of the selected element, or template information comprising parameters and formatting for the selected element.

5. A computer program stored on a computer program product for automatically generating a corresponding entity template linked to a graphic element when copying the graphic element, comprising the steps of:
   (a) receiving by a processor in an engineering system via an input device a copy command comprising a request to create a copy of a selected graphic element, wherein the selected graphic element consists of a graphic symbol constructed by a grouping of basic graphic elements arranged into the graphic symbol;
   (b) prior to executing the copy command of the selected graphic element, automatically checking by the processor whether the selected graphic element is linked to a user modifiable entity template stored in memory of the engineering system, wherein the user modifiable entity template consists of a re-useable information unit describing the selected graphic element in information technology terms; and if the selected graphic element is not linked to the user modifiable entity template,
      (i) automatically generating a corresponding user modifiable entity template based on information describing the selected graphic element in information technology terms,
      (ii) storing the corresponding user modifiable entity template in memory of the engineering system, and (iii) linking the selected graphic element to the corresponding user modifiable entity template generated; and (c) executing the copy command by
(i) copying the selected graphic element to create a copy of the selected graphic element, and
(ii) linking the copy to the corresponding user modifiable entity template, such that both the selected graphic element and the copy created are now both linked to the corresponding user modifiable entity template;

wherein the user modifiable entity template is adapted to be user-modifiable such that modifications made to the user modifiable entity template are rendered, based on the linking, to the selected graphic element and the copy of the selected graphic element.

6. The computer program of claim 5 wherein the information describing the selected element comprises one or more of type information for describing the structure and behaviour of the selected element, or template information comprising parameters and formatting for the selected element.

* * * * *